(12) United States Patent
Rajagopal et al.

(10) Patent No.: US 11,316,526 B1
(45) Date of Patent: Apr. 26, 2022

(54) PIECEWISE CALIBRATION FOR HIGHLY NON-LINEAR MULTI-STAGE ANALOG-TO-DIGITAL CONVERTER

(71) Applicant: Texas Instruments Incorporated, Dallas, TX (US)

(72) Inventors: Narasimhan Rajagopal, Chennai (IN); Visvesvaraya Appala Pentakota, Bengaluru (IN); Eeshan Miglani, Chhindwara (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/126,157

(22) Filed: Dec. 18, 2020

(51) Int. Cl.
*H03M 1/10* (2006.01)
*H03M 1/16* (2006.01)

(52) U.S. Cl.
CPC ......... *H03M 1/1047* (2013.01); *H03M 1/164* (2013.01)

(58) Field of Classification Search
CPC ...... H03M 1/1047; H03M 1/164; H03M 1/12; H03M 1/1205
USPC .................. 341/155, 143, 122, 144, 118, 120
See application file for complete search history.

(56) References Cited

U.S. PATENT DOCUMENTS

| | | | |
|---|---|---|---|
| 4,612,533 | A | 9/1986 | Evans |
| 4,899,071 | A | 2/1990 | Morales |
| 4,928,103 | A | 5/1990 | Lane |
| 5,317,721 | A | 5/1994 | Robinson |
| 5,495,247 | A | 2/1996 | Yamamoto et al. |
| 5,563,533 | A | 10/1996 | Cave et al. |
| 5,821,780 | A | 10/1998 | Hasegawa |
| 6,002,352 | A | 12/1999 | El-Ghoroury et al. |
| 6,046,612 | A | 4/2000 | Taft |

(Continued)

FOREIGN PATENT DOCUMENTS

| | | |
|---|---|---|
| JP | H05206801 | 8/1993 |
| KR | 20000028857 | 5/2000 |

(Continued)

OTHER PUBLICATIONS

U.S. Appl. No. 16/517,796, Notice of Allowance, dated Feb. 6, 2020, p. 7.

(Continued)

*Primary Examiner* — Peguy Jean Pierre
(74) *Attorney, Agent, or Firm* — Mark Allen Valetti; Charles A. Brill; Frank D. Cimino

(57) ABSTRACT

An analog-to-digital converter includes a voltage-to-delay device, such as a pre-amplifier array, for generating a delay signal based on a first voltage, and delay-based stages for generating digital signals based on the delay signal. In operation, the delay signal is transmitted to a first delay-based stage, or to an intermediate delay-based stage, bypassing the first delay-based stage, to overcome non-linearity of previous stages. If desired, different pre-amplifiers may be used to generate signals for calibration of different delay-based stages. The present disclosure may also involve converting to pseudo-static signals before signals are handed over to a calibration engine, to ease timing and preserve interface area and power. If desired, simple delay elements may be used to correct for non-linearity in a delay-based analog-to-digital converter. The present disclosure may be employed, if desired, in connection with any suitable cascade of non-linear stages.

21 Claims, 7 Drawing Sheets

(56) References Cited

U.S. PATENT DOCUMENTS

| | | |
|---|---|---|
| 6,069,579 A | 5/2000 | Ito et al. |
| 6,124,746 A | 9/2000 | Van Zalinge |
| 6,144,231 A | 11/2000 | Goldblatt |
| 6,314,149 B1 | 11/2001 | Daffron |
| 6,377,200 B1 | 4/2002 | Lee |
| 6,822,596 B2 | 11/2004 | Theiler |
| 6,836,127 B2 | 12/2004 | Marshall |
| 7,046,179 B1 | 5/2006 | Taft et al. |
| 7,233,172 B2 | 6/2007 | Kanamori et al. |
| 7,262,724 B2 | 8/2007 | Hughes et al. |
| 7,379,007 B2 | 5/2008 | Noguchi |
| 7,405,689 B2 | 7/2008 | Kernahan et al. |
| 7,501,862 B2 | 3/2009 | Su et al. |
| 7,525,471 B2 | 4/2009 | Prodic et al. |
| 7,557,746 B1 | 7/2009 | Waltari |
| 7,737,875 B2 | 6/2010 | Waltari et al. |
| 7,738,265 B2 | 6/2010 | Trattler |
| 7,847,576 B2 | 12/2010 | Kojima |
| 7,916,064 B2 | 3/2011 | Lin et al. |
| 7,919,994 B2 | 4/2011 | Walker |
| 8,089,388 B2 | 1/2012 | Cui et al. |
| 8,130,130 B2 | 3/2012 | Danjo et al. |
| 8,183,903 B2 | 5/2012 | Glass et al. |
| 8,373,444 B2 | 2/2013 | Lee et al. |
| 8,421,664 B2 | 4/2013 | Ryu et al. |
| 8,773,169 B2 | 7/2014 | Dinc et al. |
| 8,836,375 B2 | 9/2014 | Ghatak |
| 8,896,476 B2 | 11/2014 | Harpe |
| 9,369,137 B2 | 6/2016 | Masuko |
| 9,455,695 B2 | 9/2016 | Kull et al. |
| 9,467,160 B2 | 10/2016 | Chang |
| 9,685,971 B2 | 6/2017 | Harada |
| 9,742,424 B2 | 8/2017 | Sharma et al. |
| 9,917,590 B2 | 3/2018 | Zhang et al. |
| 10,284,188 B1 | 5/2019 | Soundarajan et al. |
| 10,673,452 B1 | 6/2020 | Soundararajan et al. |
| 10,673,453 B1 | 6/2020 | Pentakota et al. |
| 10,673,456 B1 | 6/2020 | Dusad et al. |
| 10,778,243 B2 * | 9/2020 | Pentakota ............ H03K 5/2481 |
| 10,958,258 B2 | 3/2021 | Soundararajan et al. |
| 2005/0104626 A1 | 5/2005 | Wakamatsu et al. |
| 2006/0158365 A1 | 7/2006 | Kemahan et al. |
| 2008/0297381 A1 | 12/2008 | Kemahan et al. |
| 2009/0302888 A1 | 12/2009 | Shumarayev et al. |
| 2010/0085101 A1 | 4/2010 | Walker |
| 2012/0105264 A1 | 5/2012 | Ryu et al. |
| 2012/0176158 A1 | 7/2012 | Lee et al. |
| 2012/0212358 A1 | 8/2012 | Shi et al. |
| 2013/0009796 A1 | 1/2013 | Sakiyama et al. |
| 2013/0021118 A1 | 1/2013 | Kabir et al. |
| 2013/0169463 A1 | 7/2013 | Stein et al. |
| 2014/0361917 A1 | 12/2014 | Matsuno et al. |
| 2015/0008894 A1 | 1/2015 | Cannankurichi et al. |
| 2015/0244386 A1 | 8/2015 | El-Chammas |
| 2015/0260552 A1 | 9/2015 | Yao et al. |
| 2019/0007071 A1 | 1/2019 | Nagarajan et al. |
| 2019/0280703 A1 | 9/2019 | Naru et al. |
| 2020/0195268 A1 | 6/2020 | Soundarajan et al. |
| 2020/0204184 A1 | 6/2020 | Rattan |

FOREIGN PATENT DOCUMENTS

| | | |
|---|---|---|
| KR | 2001044806 | 2/2001 |
| KR | 20020015863 | 3/2002 |

OTHER PUBLICATIONS

U.S. Appl. No. 16/410,698, Notice of Allowance, dated Feb. 10, 2020, p. 6.

International Search Report in corresponding PCT Patent Application No. PCT/2018-068162, dated Apr. 25, 2019 (2 pages).

U.S. Appl. No. 17/158,526, Notice of Allowance, dated Jan. 14, 2022, p. 8.

* cited by examiner

PIECEWISE CALIBRATION FOR HIGHLY NON-LINEAR MULTI-STAGE ANALOG-TO-DIGITAL CONVERTER

BACKGROUND

An analog-to-digital (A/D) converter (ADC) may be used to generate digital codes which represent the level of an analog signal. A radio-frequency (RF) sampling receiver may be used to receive and digitize a high frequency analog signal. An analog-to-digital converter for digitizing a signal in a radio-frequency sampling receiver may be required to operate at high speed. Analog-to-digital converters are described in United States Patent Application Publications Nos. 2012/0212358 (Shi et al.), 2015/0244386 (El-Chammas), 2019/0007071 (Nagarajan et al.), and 2019/0280703 (Naru et al.).

Some analog-to-digital converters have one or more voltage-to-delay (V2D) components and operate, at least in part, in a delay domain. Delay-based analog-to-digital converters are described in U.S. Patent Applications Nos. 16/217,643 (Soundararajan et al., filed Dec. 12, 2018, now U.S. Pat. No. 10,673,452), Ser. No. 16/410,698 (Dusad et al., filed May 13, 2019, now U.S. Pat. No. 10,673,456), and Ser. No. 16/517,796 (Pentakota et al., filed Jul. 22, 2019, now U.S. Pat. No. 10,673,453; see also U.S. Pat. No. 10,778,243 (a continuation of the '453 patent)). The entire disclosures of U.S. patent application Ser. Nos. 16/217,643, 16/410,698 and 16/517,796 are incorporated herein by reference. Delay-based analog-to-digital converters may be operated, if desired, at high speed, and with reduced area and power requirements.

SUMMARY

The present disclosure relates to an analog-to-digital converter including: a voltage-to-delay device having a first voltage input and a delay signal output based on the first voltage input; a first delay-based stage having an output, the first delay-based stage having an input coupled to the delay signal output; successive delay-based stages, each having an input coupled to the output of the first delay-based stage through a preceding successive delay-based stage and each successive delay-based stage having a digital signal output based on the input of such successive delay-based stage; and a bypass line connected between the delay signal output and an input of an intermediate one of the successive delay-based stages.

According to one aspect of the present disclosure, the analog-to-digital converter includes a calibration engine/controller for selecting a first pre-amplifier from a pre-amplifier array when the delay signal is applied to the first delay-based stage, and for selecting a second, different pre-amplifier when the delay signal is applied to the intermediate one of the successive delay-based stages. According to this aspect of the disclosure, calibration of the back end may be performed in a piecewise manner for successive, non-linear devices.

The present disclosure also relates to an analog-to-digital converter which includes: a front end having a first voltage input and a calibration voltage input, the front end having a voltage-to-delay device having a delay signal output based on the first voltage input; and a back end connected to the front end and having a digital signal output representative of the first voltage and the calibration voltage; and wherein the back end includes a first delay-based stage connected to the delay signal output, and successive delay-based stages coupled to the first delay-based stage for generating digital signals based on the delay signal output; and wherein the analog-to-digital converter includes a bypass line connected between the delay signal output and an input of an intermediate one of the successive delay-based stages.

The present invention also relates to a method of calibrating an analog-to-digital converter having a voltage-to-delay device, a first delay-based stage and successive delay-based stages. The method includes causing the voltage-to-delay device to generate a delay signal based on a calibration voltage; providing the delay signal to the first delay-based stage; providing an output of the first delay-based stage to an input of a successive delay-based stage, the output of the first delay-based staged based on the delay signal; providing an output of each successive delay-based stage to an input of a next successive delay-based stage, the output of each successive delay-based stage is based on the input of such successive delay-based stage, and successive delay-based stages connected to the first delay-based stage, and causing the first delay-based stage and the successive delay-based stages to generate digital signals based on the delay signal; and directly providing the delay signal to an intermediate one of the successive delay-based stages.

The present disclosure has broad applicability to a variety of devices and is not limited to the devices and methods shown and described herein by example. Among other things, the present disclosure may be employed in connection with any suitable cascade of non-linear stages. Thus, the present disclosure relates to an analog-to-digital converter which has, among other things, a circuit device for generating a front end signal based on a first voltage; a first non-linear stage connected to the circuit device, and successive non-linear stages connected to the first non-linear stage, for generating digital signals based on the front end signal; a first line connected to the circuit device, for transmitting the front end signal to the first non-linear stage; and a bypass line connected to the circuit device, for transmitting the front end signal to an intermediate one of the successive non-linear stages.

BRIEF DESCRIPTION OF THE DRAWINGS

Like elements are designated by like reference numerals and other characters throughout the drawings.

DETAILED DESCRIPTION

Figure 1:
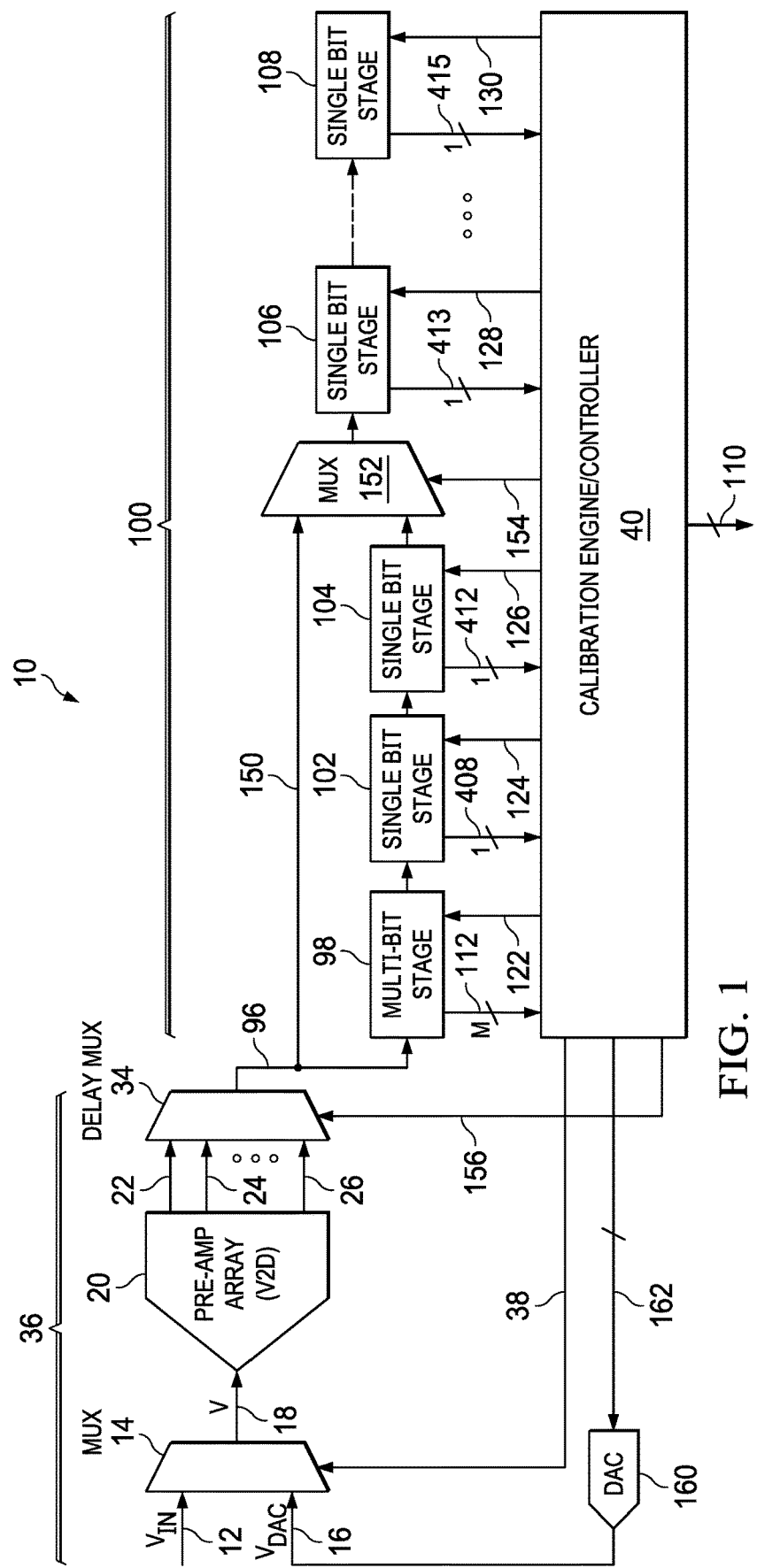
FIG. 1 is a block diagram of a delay-based analog-to-digital converter.

FIG. 1 illustrates an analog-to-digital converter 10 constructed in accordance with the present disclosure. The converter 10 has a first input line 12 for inputting a first voltage $V_{IN}$ to a first multiplexer 14, a second input line 16 for inputting a calibration voltage $V_{DAC}$ to the first multiplexer 14, a first output line 18 for transmitting an analog voltage V—either the first voltage $V_{IN}$ or the calibration voltage $V_{DAC}$—to a pre-amplifier array 20. If desired, the first multiplexer 14 may be an analog multiplexer; however, the present disclosure should not be limited to the examples described herein.

Figure 2:
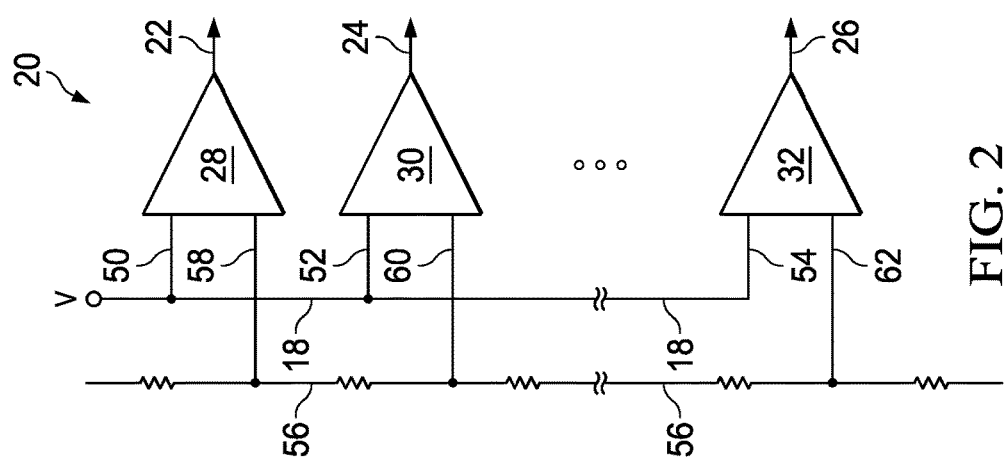
FIG. 2 is a block diagram of a pre-amplifier array of the analog-to-digital converter of FIG. 1.

The pre-amplifier array 20 is a voltage-to-delay device and has first and second through n-th signal lines 22, 24 and 26 for outputting delay signals from corresponding first and second through n-th pre-amplifiers 28, 30 and 32 (FIG. 2). Pre-amplifier array 20 transmits the delay signals to a delay multiplexer 34 (FIG. 1) via signal lines 22, 24 and 26. In an alternative embodiment, each pre-amplifier 28, 30 and 32 has two outputs (one output is the complement of the other), so there are two signal lines 22, 24 and 26 for each pre-amplifier 28, 30 and 32. The pre-amplifiers 28, 30 and 32 themselves are voltage-to-delay devices.

The voltage V is converted to a delay input by the pre-amplifier array 20. The pre-amplifier array 20 may have two, three or more than three pre-amplifiers (n=2, 3 or more), and a corresponding number of delay-signal lines 22, 24 and 26. The first multiplexer 14 (FIG. 1), the pre-amplifier array 20 and the delay multiplexer 34 are elements of the front end 36 of the analog-to-digital converter 10. In operation, the front end 36 receives and selectively processes the first voltage $V_{IN}$ and the calibration voltage $V_{DAC}$. The first and second though n-th signal lines 22, 24 and 26 are located within the front end 36. The delay signals on lines 22, 24 and 26 may be referred to herein as examples of front end signals.

In operation, the first multiplexer 14 selectively outputs the first voltage $V_{IN}$ or the calibration voltage $V_{DAC}$, under the control of a signal on line 38 from a calibration engine/controller 40. If desired, the calibration engine/controller 40 may be a calibration engine/digital controller; however, the present disclosure should not be limited to the examples described herein. The first voltage $V_{IN}$ is selected and output as voltage V when the analog-to-digital converter 10 operates in an operation mode. The calibration voltage $V_{DAC}$ is selected and output as the voltage V when the analog-to-digital converter 10 operates in a calibration mode. The calibration engine/controller 40 controls the operation of the first multiplexer 14 via the signal line 38 and thereby causes the analog-to-digital converter 10 to switch between the operation and calibration modes.

Referring now to FIG. 2, the voltage V output from the first multiplexer 14 on line 18 is applied to first inputs 50, 52 and 54 of the pre-amplifiers 28, 30 and 32. If desired, the preamplifiers 28, 30 and 32 may be threshold-integrated pre-amplifiers. The pre-amplifiers 28, 30 and 32 may be matched or unmatched. The present disclosure should not be limited to the illustrated pre-amplifiers 28, 30 and 32. If desired, the delay signals on lines 22, 24 and 26 may be generated by other suitable pre-amplifiers or by some other suitable voltage-to-delay device or system.

In the illustrated example, divided threshold voltages on line 56 are applied to second inputs 58, 60 and 62 of the preamplifiers 28, 30 and 32. The voltage at the top of the resistor chain may be, for example, within a range of from twenty-five to thirty-five volts, or it may be, for example, twenty-five volts. In an alternative embodiment, the voltage at the top of the resistor chain is a voltage that is sufficiently greater than the expected values for $V_{IN}$. The outputs of the pre-amplifiers 28, 30 and 32 on lines 22, 24 and 26 are characteristic of the differences between the voltage V on line 18 (that is, the first voltage $V_{IN}$ in the operation mode, or the calibration voltage $V_{DAC}$ in the calibration mode) and the respective threshold voltage. In operation, as described below in connection with the timing diagram of FIG. 6, one of the delay signals is selected, by the delay multiplexer 34, and applied on line 96 (FIG. 1) to a multi-bit stage (a first stage, which is an example of a non-linear stage) 98 of a back end 100 of the analog-to-digital converter 10.

If desired, all of the elements of the front and back ends 36 and 100 may be integrated into an integrated circuit (IC) and/or formed on or over a single semiconductor die (not shown in the drawings) according to various semiconductor and/or other processes. The conductive lines may be metal structures formed in insulating layers over the semiconductor die, doped regions (that may be silicided) formed in the semiconductor die, or doped semiconductor structures (that may be silicided) formed over the semiconductor die. Transistors used to implement the circuit structures of the example embodiments may be bipolar junction transistors (BJT) or metal-oxide-semiconductor field-effect transistors (MOSFET) and can be n-type or p-type. The integrated devices and elements may also include resistors, capacitors, logic gates and other suitable electronic devices that are not shown in the drawings for the sake of clarity.

In addition to the multi-bit stage 98, the back end 100 has first, second and third through i-th single-bit stages 102, 104, 106 and 108 which are connected in series to the multi-bit stage 98. The back end 100 may have three, four or more than four such single-bit stages (i=3, 4 or more). (The single-bit stages 102, 104, 106 and 108 are examples of successive non-linear stages.) In the operation mode, the back end 100 works with the calibration engine/controller 40 to resolve the delay signal on line 96 to a multi-bit digital code which is output on line 110. The number of bits in the digital code on line 110 equals M+i (the value of M is described below). In the operation mode, the digital code on line 110 predictably corresponds to a value which closely approximates the first voltage $V_{IN}$. In the calibration mode, the back end 100 works with the calibration engine/controller 40 to determine correction values for the multi-bit and single-bit stages 98, 102, 104, 106 and 108. Then, when the analog-to-digital converter 10 returns to the operation mode, correction signals are applied, on lines 122, 124, 126, 128 and 130, so that the multi-bit and single-bit stages 98, 102, 104, 106 and 108 operate correctly and the code that is output on line 110 accurately corresponds to a close approximation of the first voltage $V_{IN}$.

The multi-bit stage 98 may have delay circuits and delay comparators, operated in parallel, for generating M bits of digital information, on line 112. In the illustrated example of FIG. 3, M=2. However, M may be greater than 2. This disclosure is not limited to the illustrated example. Delay residue from the multi-bit stage 98 may be combined by a combiner 304 (FIG. 3) and applied to the first single-bit stage 102. If desired, the first, second, and third through i-th single-bit stages 102, 104, 106 and 108 (FIG. 1) may be constructed and operated in successive stages, to provide respective bits of digital information to the calibration engine/controller 40.

In the illustrated configuration, each single-bit stage 102, 104, 106 and 108 represents a single binary bit in the final code on line 110. The single bits are transmitted to the calibration engine/controller on lines 408, 412, 413 and 415. In the illustrated configuration, the single bits may be reflected in less significant bits of the binary values illustrated in Table 1 below. The multi-bit stage 98 represents multiple binary bits (at least two bits) in the final code. In the illustrated configuration, where M=2, the two bits of digital information on line 112 may correspond to the most significant bits of the binary values illustrated in Table 1. The two bits of digital information are derived from four binary data points as discussed below in connection with FIG. 3. The binary numbers resolved by the back end 100 should "toggle" (that is, change) at particular binary segments of the voltage input range, that is, where voltage V is approximately equal to the respective threshold voltage applied to a respective pre-amplifier 28, 30 and 32.

For example, in the illustrated configuration, when the voltage V on line 18 (50, FIG. 2) decreases from a first value that is greater than, but close to, the threshold voltage of the first pre-amplifier 28 to a second value that is less than, but close to, the threshold voltage of the first pre-amplifier 28, the binary number resolved by the back end 100 may change from a first binary number to a second binary number. In the same example, when the voltage V on line 18 increases from the second value to the first value, the binary number resolved by the back end 100 may change from the second binary number to the first binary number. Thus, when the voltage on line 18 crosses the threshold voltage of the first pre-amplifier 28, from above or below, the binary number resolved by the back end 100 may toggle from one of the first and second binary numbers to the other.

Likewise, when the voltage V on line 18 (52) decreases from a third value that is greater than, but close to, the threshold voltage of the second pre-amplifier 30 to a fourth value that is less than, but close to, the threshold voltage of the second pre-amplifier 30, the binary number resolved by the back end 100 may change from a third binary number to a fourth binary number. When the voltage V on line 18 increases from the fourth value to the third value, the binary number resolved by the back end 100 may change from the fourth binary number to the third binary number. When the voltage on line 18 crosses the threshold voltage of the second pre-amplifier 30, from above or below, the binary number resolved by the back end 100 may toggle from one of the third and fourth binary numbers to the other. A similar toggling effect may be observed every time the voltage V on line 18 crosses any one of the threshold voltages of the pre-amplifier array 20.

Thus, calibration of the stages 98, 102, 104, 106 and 108 may be performed in a manner analogous to offset correction of a voltage comparator. However, since the illustrated stages 98, 102, 104, 106 and 108 operate in delay domain, not voltage domain, the corrections are not made by adding or subtracting voltage but by adding or subtracting delay elements to the stage inputs. The appropriate corrections are determined by (1) applying a desired input, (2) receiving the bits that are output as a result, and then, (3) based on that output, applying correction delay elements until the output toggles as desired according to the input. In the illustrated configuration, the desired input is the calibration voltage $V_{DAC}$ on line 16, which is generated by a digital-to-analog (D/A) converter (DAC) 160 under the control of the calibration engine/controller 40, via a suitable digital signal on line 162. The digital signal for setting the desired calibration voltage $V_{DAC}$ is determined, and applied to line 162, by the calibration engine/controller 40 during the calibration mode.

Figure 3:
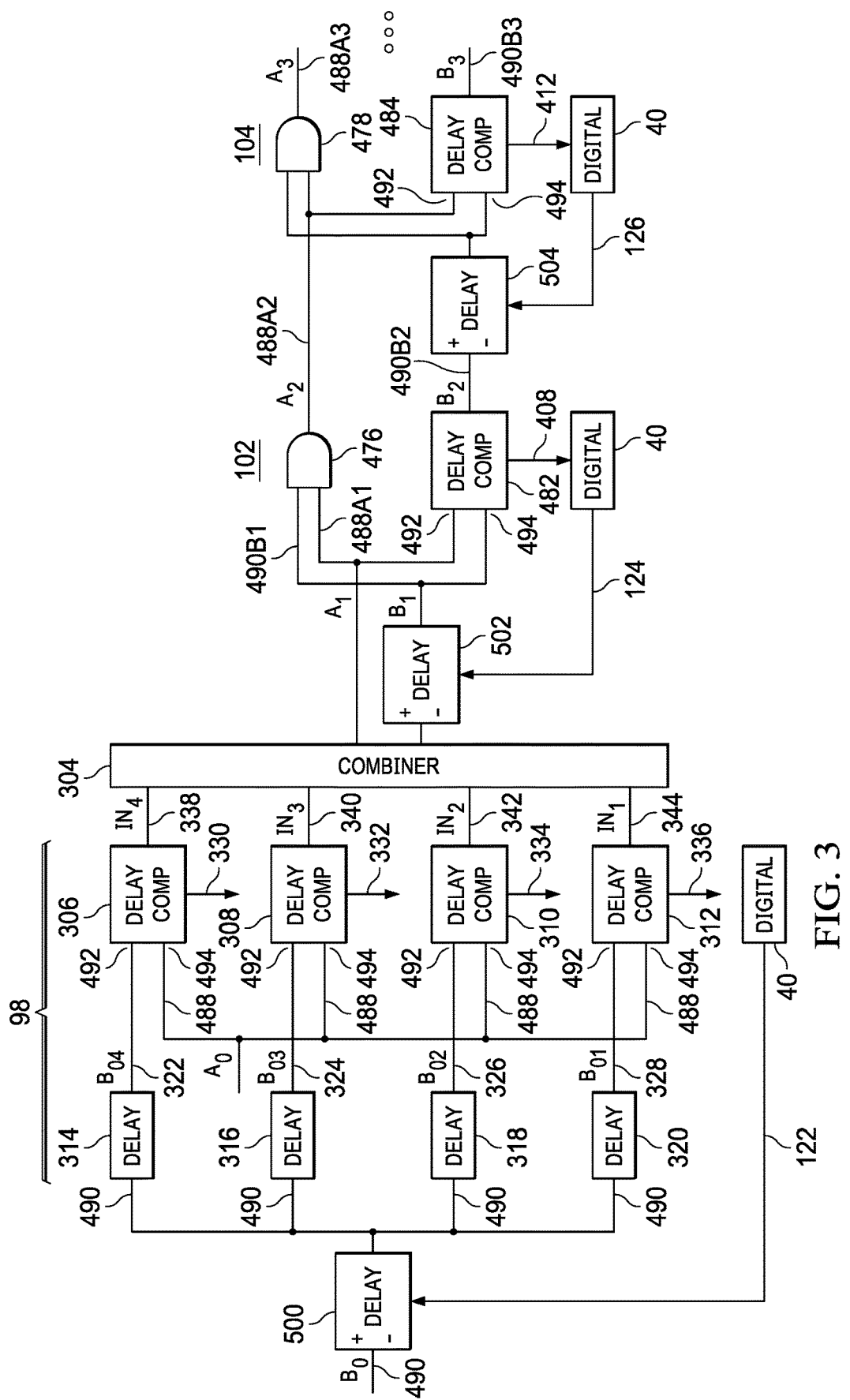
FIG. 3 is a block diagram of a portion of the analog-to-digital converter of FIG. 1, with a more-detailed illustration of a first, multi-bit, delay-based stage and successive, single-bit, delay-based stages.

FIG. 3 illustrates, in greater detail than in FIG. 1, the first, second and third stages 98, 102 and 104 of the analog-to-digital converter 10. The first stage 98 has four delay comparators 306, 308, 310 and 312, and is connected to the combiner 304. This disclosure is not limited, however, to the details of the illustrated example. This disclosure may be implemented, if desired, with a first stage which has fewer or more than four delay comparators. In the configuration shown in the drawings, the first stage 98 generates two bits of digital information for the calibration engine/controller 40. In the illustrated embodiment, each one of the successive stages 102, 104, 106 and 108 generates a single bit of digital information for the calibration engine/controller 40. Details of the successive stages 102, 104, 106 and 108 are described below.

In the FIG. 3 configuration, first and second signals $A_0$ and $B_0$ are received from the delay multiplexer 34 on respective first and second conductive output lines 488 and 490. The two output lines 488 and 490, which transmit the first and second signals $A_0$ and $B_0$, respectively, are represented in the schematic view of FIG. 1 by a single line 96. In operation, the first and second signals $A_0$ and $B_0$ are transmitted from the delay multiplexer 34 (FIG. 1) to the delay comparators 306, 308, 310 and 312 and delay circuits 314, 316, 318 and 320, respectively, of the first stage 98 (FIG. 3).

The delay between the timings of signals $A_0$ and $B_0$ corresponds to the delay between the timings of signals generated by first and second complementary outputs of a pre-amplifier (one of the pre-amplifiers 28, 30 and 32) selected by the delay multiplexer 34. In the block diagrams of FIGS. 1 and 2, the complementary outputs of the first pre-amplifier 28 are transmitted on suitable lines which are schematically illustrated by line 22, the complementary outputs of the second pre-amplifier 30 are transmitted on suitable lines which are schematically illustrated by line 24, and the complementary outputs of the n-th pre-amplifier 32 are transmitted on lines which are schematically illustrated by line 26.

In the illustrated example, the leading edge of the signal $B_0$ on the second output line 490 precedes the leading edge of the signal $A_0$ on the first output line 488. The first signal $A_0$ is applied to threshold inputs 494 of the delay comparators 306, 308, 310 and 312. In the illustrated configuration, the delay comparators 306, 308, 310 and 312 are essentially identical to each other. To the extent that the delay comparators 306, 308, 310 and 312 are not essentially identical, the calibration circuitry/methodology of some example embodiments will correct for the differences between the delay comparators 306, 308, 310 and 312 (discussed in more detail below). The second signal $B_0$ is applied to four different delay circuits 314, 316, 318 and 320 which generate four corresponding signals $B_{04}$, $B_{03}$, $B_{02}$ and $B_{01}$ on respective output lines 322, 324, 326 and 328.

The timings of the corresponding signals $B_{04}$, $B_{03}$, $B_{02}$ and $B_{01}$ are delayed relative to the timing of the signal $B_0$ on line 490 by different, known amounts each of which is less than or equal to the maximum gain of the pre-amplifier selected by the delay multiplexer 34. The delayed signals $B_{04}$, $B_{03}$, $B_{02}$ and $B_{01}$ are applied to first inputs 492 of the respective delay comparators 306, 308, 310 and 312. The first delay comparator 306 issues a sign signal on line 330 representative of which signal ($B_{04}$ or $A_0$) arrives at the first delay comparator 306 first. Likewise, the second delay comparator 308 issues a sign signal on line 332 representative of which signal ($B_{03}$ or $A_0$) arrives at the second delay comparator 308 first. Likewise, the third and fourth delay comparators 310 and 312 issue sign signals on lines 334 and 336 representative of which signals arrive at the third and fourth delay comparators 310 and 312 first.

Since the delay circuits 314, 316, 318 and 320 (FIG. 3) are different from each other, the timings of the leading edges of the delayed signals $B_{04}$, $B_{03}$, $B_{02}$ and $B_{01}$ are different from each other. Each one of the delay comparators 306, 308, 310 and 312 issues a sign signal, on respective digital lines 330, 332, 334 and 336, to the calibration engine/controller 40. The sign signals on lines 330, 332, 334 and 336 are functionally related to the difference in timing between the leading edges of the signals $A_0$ and $B_0$ received from the delay multiplexer 34, and are therefore functionally related to the voltage V on line 18. The four lines 330, 332, 334 and 336 illustrated in FIG. 3 are schematically represented in consolidated form in FIG. 1 by line 112.

Since the amounts of delay provided by the four delay comparators 306, 308, 310 and 312 are different from each other, the sign signals 330, 332, 334 and 336 provide four binary data points for determining two bits of the output on line 110 (FIG. 1). In the illustrated configuration, where M=2, the two bits of digital information on line 112 may correspond to the most significant bits of the binary values illustrated in Table 1. For example, if $B_0$ precedes $A_0$, and $B_{01}$ precedes $A_0$, then the calibration engine/controller 40 determines that the delay between the timings of signals $A_0$ and $B_0$ is greater than the delay contributed by the fourth delay circuit 320. Likewise, if $B_0$ precedes $A_0$, and $A_0$ precedes $B_{02}$, $B_{03}$ and $B_{04}$. then the calibration engine/controller 40 determines that the delay between the timings of signals $A_0$ and $B_0$ is less than each of the delays contributed by the third, second and first delay circuits 318, 316 and 314.

If desired, the structure and operation of the delay comparators 306, 308, 310 and 312 may be the same as those of a delay comparator 482 described below. In operation, the delay comparators 306, 308, 310 and 312 generate respective delay signals $IN_4$, $IN_3$, $IN_2$ and $IN_1$ on respective output lines 338, 340, 342 and 344. The delay signals $IN_4$, $IN_3$, $IN_2$ and $IN_1$ are applied to the combiner 304 by the output lines 338, 340, 342 and 344. In the illustrated configuration, the delay circuits 314, 316, 318 and 320 are different from each other and contribute different amounts of delay, while the delay comparators 306, 308, 310 and 312 are essentially the same. Therefore, the timings of the leading edges of the delay signals $IN_4$, $IN_3$, $IN_2$ and $IN_1$ illustrated in FIG. 3 are different from each other. If the four delay circuits were the same, and if the delay comparators 306, 308, 310 and 312 were also the same, then the timings of the leading edges of the delay signals generated by the delay comparators would not be different from each other.

Figure 4:
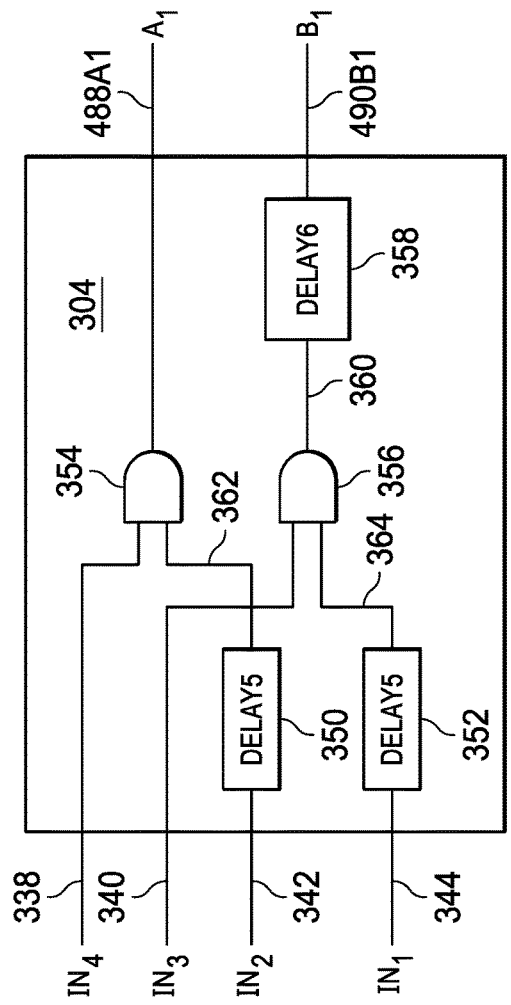
FIG. 4 is a block diagram of a combiner for connecting the multi-bit stage of FIG. 3 to a first one of the single-bit stages.

FIG. 4 illustrates a combiner of one example embodiment. In this example embodiment, the combiner 304 has two fifth delay circuits 350 and 352, two AND gates 354 and 356, and a sixth delay circuit 358. In the illustrated configuration, the fifth delay circuits 350 and 352 are essentially identical to each other. As noted above, however, this disclosure is not limited to the details of the configurations shown and described herein. The third and fourth delay signals $IN_2$ and $IN_1$ are applied to the fifth delay circuits 350 and 352, on conductive lines 342 and 344, and the first and second delay signals $IN_4$ and $IN_3$ are applied to the AND gates 354 and 356, on conductive lines 338 and 340. Output signals from the fifth delay circuits 350 and 352 are also applied to the AND gates 354 and 356, on conductive lines 362 and 364, respectively. An output signal from one of the AND gates 356 is applied to the sixth delay circuit 358, on a conductive line 360, and the other AND gate 354 generates a signal $A_1$ on conductive line 488A1. The sixth delay circuit 358 generates a signal $B_1$ on conductive line 490B1.

In operation, the timing of the leading edges of the signals output from the fifth and sixth delay circuits 350, 352 and 358 on conductive lines 362, 364 and 490, are delayed relative to the respective timings of the leading edges of the signals input to the delay circuits 350, 352 and 358. The timings of the leading edges of signals output from the AND gates 354 and 356, on lines 488A1 and 360, correspond to the respective timings of the later-arriving of the signals input to the AND gates 354 and 356. The relative timing of the leading edges of the signals $A_1$ and $B_1$ on lines 488A1 and 490B1 is functionally (that is, predictably) related to the voltage V on line 18 (FIG. 2). In other words, the delay circuits 350, 352 and 358 and the logic gates 354 and 356 establish a transfer function between the delay of the incoming signals $IN_4$, $IN_3$, $IN_2$ and $IN_1$ and the delay of the first and second signals $A_1$ and $B_1$.

For the illustrated configuration, the transfer function is as follows: [A] if the timing of the signal on line 338 precedes the timing of the signal on line 362 (where the timing of the signal on line 362 corresponds to the timing of the signal on line 342 delayed by the fifth delay circuit 350), then the timing of the signal on line 488A1 corresponds to the timing of the signal on line 362, but if the timing of the signal on line 362 precedes the timing of the signal on line 338, then the timing of the signal on line 488A1 corresponds to the timing of the signal on line 338; [B] if the timing of the signal on line 340 precedes the timing of the signal on line 364 (where the timing of the signal on line 364 corresponds to the timing of the signal on line 344 delayed by the fifth delay circuit 352), then the timing of the signal on line 360 corresponds to the timing of the signal on line 364, but if the timing of the signal on line 364 precedes the timing of the signal on line 340, then the timing of the signal on line 360 corresponds to the timing of the signal on line 340; and [C] the timing of the signal on line 490B1 corresponds to the timing of the signal on line 360 delayed by the sixth delay circuit 358.

The amounts by which the delay elements 350, 352 and 358 delay the signals transmitted through them may be selected to maximize or improve the gain of the first and second signals $A_1$ and $B_1$ to the extent practicable. The combiner 304 operates in delay mode, where gain relates to delay (not voltage). If the gain of the first and second signals $A_1$ and $B_1$ is too low, meaning that the timings of the first and second signals $A_1$ and $B_1$ are too close to each other, then the information represented by the relative timing of those signals may be difficult to resolve.

The present disclosure should not be limited, however, to the configuration illustrated in FIG. 4 and its associated transfer function. An important aspect of the present disclosure is that the timings of the signals on lines 488A1 and 490B1 are functionally (that is, predictably) related to the timings of the signals on lines 338, 340, 342 and 344. If a certain set of signal timings on lines 338, 340, 342 and 344 results in a first set of signal timings on lines 488A1 and 490B1, the same first set of signal timings on lines 488A1 and 490B1 may be expected to occur whenever the same set of signal timings occurs on lines 338, 340, 342 and 344. Likewise, if another set of signal timings on lines 338, 340, 342 and 344 results in a second set of signal timings on lines 488A1 and 490B1, the same second set of signal timings on lines 488A1 and 490B1 may be expected to occur whenever the other set of signal timings occurs on lines 338, 340, 342 and 344. And since the timings of the signals on lines 338, 340, 342 and 344 are functionally (that is, predictably) related to the voltage V, the timings of the signals on lines 488A1 and 490B1 are also functionally related to the voltage V.

Referring again to FIG. 3, the signals $A_1$ and $B_1$ generated by the combiner 304 are applied to the second stage 102 on the output lines 488A1 and 490B1. The second stage (which is a first residual stage) 102 is coupled to the first stage 98 (through the combiner 304), the third stage 104 (which is a second residual stage) is coupled to the second stage 102, and a second multiplexer 152 (FIG. 1) (an example of a delay-signal multiplexer) is connected to the third stage 104.

In the illustrated example, the second through i-th stages 102, 104, 106 and 108 each include AND gates (such as AND gate 476 for stage 102 and AND gate 478 for stage 104) and delay comparators (such as delay comparator 482 for stage 102 and delay comparator 484 for stage 104). The illustrated AND gates are merely examples, however, of logic gates that may be employed according to this disclosure. If desired, this disclosure may be implemented with or without AND gates and/or with or without gates other than AND gates.

Referring again to FIG. 3, in the illustrated configuration, the AND gates 476 and 478 are essentially identical to each other, and the delay comparators 482 and 484 are essentially identical to each other. To the extent that these components are not essentially identical, the calibration circuitry/methodology of some example embodiments will calibrate and correct for these differences (described in more detail below). The conductive output lines 488A1 and 490B1 from the combiner 304 are coupled to inputs of the first AND gate 476 and delay comparator 482. Specifically, the conductive line 488A1 is coupled to a first input 492 of the delay comparator 482, and the conductive line 490B1 is coupled to a threshold input 494 of the delay comparator 482.

An output line 488A2 from the AND gate 476 is electrically coupled to one of the inputs of the AND gate 478, and to the input 492 of the delay comparator 484. A conductive line 490B2 from the first delay comparator 482 is electrically coupled to the other one of the inputs of the AND gate 478, and to the threshold input 494 of the delay comparator 484. In like manner, an output line 488A3 from the AND gate 478 is selectively, electrically coupled, through the second multiplexer 152 (FIG. 1), to one of the inputs of a third AND gate of the fourth stage 106, and to a first input of a delay comparator of the fourth stage 106, and a conductive line 490B3 from the second delay comparator 484 is selectively, electrically coupled, through the second multiplexer 152, to the other one of the inputs of the AND gate and to a threshold input of the delay comparator of the fourth stage 106.

The pattern created by the second and third stages 102 and 104 may be continued, separated only by the second multiplexer 152, for the fourth stage 106 and for as many additional stages as desired, up to the i-th stage 108. Each successive stage has an AND gate and a delay comparator essentially identical to the AND gates and the delay comparators of the second and third stages 102 and 104, and is electrically coupled to the AND gate and delay comparator of a preceding stage in the same way. If desired, the back end 100 may have just the second multiplexer 152, and no other multiplexer between the fourth stage 106 and the i-th single-bit stage 108. As explained in more detail below, however, the present disclosure should not be limited to the embodiment shown in the drawings. An alternative embodiment may have more than just the one second multiplexer. In the alternative embodiment, if desired, the additional multiplexer may receive one input from the preceding delay-based stage and another input from line 150.

Figure 7:
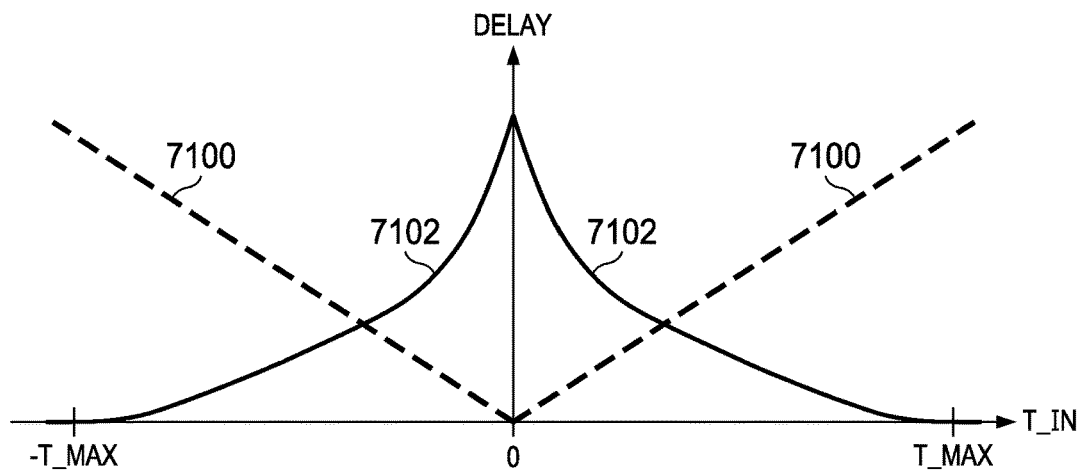
FIG. 7 is a graph which illustrates AND-gate delay and comparator delay generated by an AND gate and a delay comparator, respectively, of the analog-to-digital converter of FIG. 1, where the AND-gate delay and the comparator delay are functions of input-signal delay.

In operation, when the second multiplexer 152 is in the operation mode, and does not forward the signal on line 150, signals $A_N$ and $B_N$ (where N=1, 2, 3 . . . for the second, third . . . stages 102, 104 . . . respectively) are applied to respective ones of the AND gates 476 and 478 causing the AND gates 476 and 478 to generate corresponding signals $A_{N+1}$. For each one of the AND gates 476 and 478, the timing of the leading edge of signal $A_{N+1}$ tracks the timing of the leading edge of the later-arriving of signals $A_N$ and $B_N$. In particular, for each one of the AND gates 476 and 478, the timing of the leading edge of signal $A_{N+1}$ is equal to the timing of the leading edge of the earlier-arriving of signals $A_N$ and $B_N$ plus an amount of time that is related to the extent to which the leading edge of the later-arriving of signals $A_N$ and $B_N$ lags behind the leading edge of the earlier-arriving of signals $A_N$ and $B_N$. As illustrated in FIG. 7, the AND-gate delay 7100 contributed by a respective AND gate is linearly related to the absolute value of an input-signal delay T_IN, where the input-signal delay T_IN is the difference in timing between signals $A_N$ and $B_N$ input into the respective AND gate.

Signals $A_N$ and $B_N$ are also applied to the inputs 492 and threshold inputs 494, respectively, of the delay comparators 482 and 484, causing the delay comparators 482 and 484 to generate corresponding signals $B_{N+1}$. For each one of the delay comparators 482 and 484, the timing of the leading edge of signal $B_{N+1}$ tracks the timing of the leading edge of the earlier-arriving of signals $A_N$ and $B_N$. In particular, for each one of the delay comparators 482 and 484, the timing of the leading edge of signal $B_{N+1}$ is equal to (1) the timing of the leading edge of the earlier-arriving of signals $A_N$ and $B_N$ plus (2) a comparator delay 7102 that is logarithmically inversely related to the absolute value of the input-signal delay T_IN.

Figure 8:
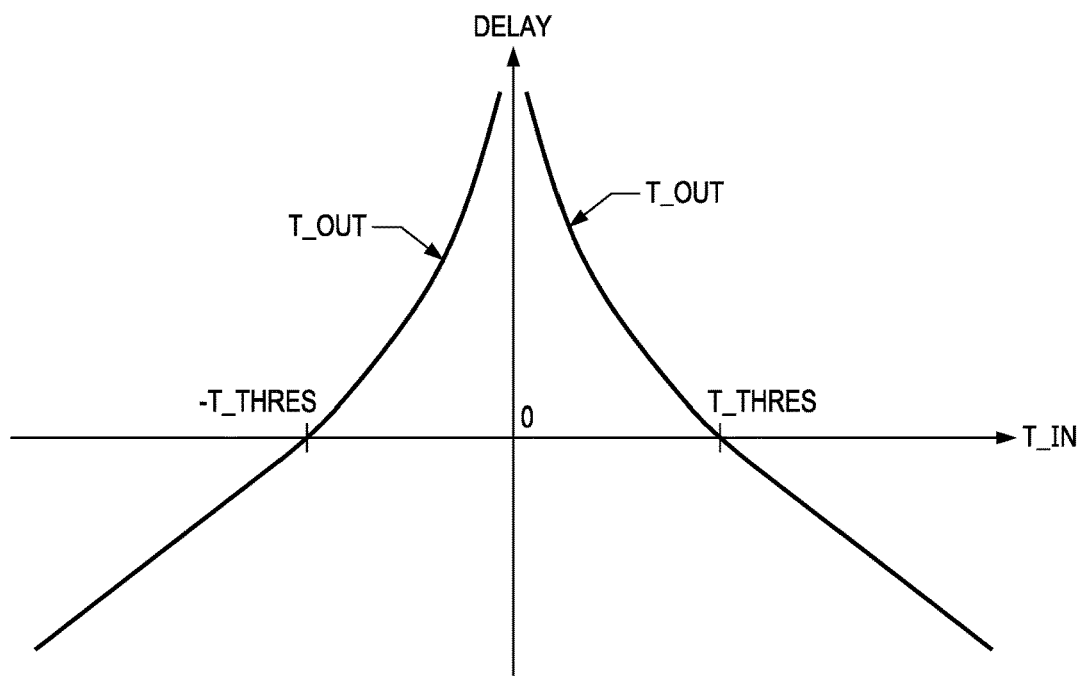
FIG. 8 is a graph which illustrates output-signal delay as a function of the input-signal delay of FIG. 7.

Subtracting the AND gate-delay 7100 from the comparator delay 7102 yields the output-signal delay T_OUT (FIG. 8) for any given single-bit stage 102, 104, 106 and 108. When the absolute value of the input-signal delay T_IN is less than a threshold delay T_THRES, then the output-signal delay T_OUT is a positive value (meaning that the leading edge of signal $B_{N+1}$ generated by the respective delay comparator 482 and 484 precedes the leading edge of signal $A_{N+1}$ generated by the respective AND gate 476 and 478). On the other hand, when the absolute value of the input-signal delay T_IN is greater than the threshold delay T_THRES, then the output-signal delay T_OUT is a negative value (meaning that the leading edge of signal $B_{N+1}$ lags behind the leading edge of corresponding signal $A_{N+1}$). The positive or negative character of the output-signal delay T_OUT is reported to the calibration engine/controller 40 on the signal line of the successive delay comparator. For example, in the illustrated configuration, the positive or negative character of the output-signal delay generated by the first single-bit stage 102 is reported to the calibration engine/controller 40 on the signal line 412 of the delay comparator 484 of the next stage 104.

In operation, the first delay comparator 482 issues a first sign signal ("1" or "0") on digital line 408 (an example of a digital output) to the calibration engine/controller 40. The first sign signal (an example of a digital signal in accordance with this disclosure) is based on which one of the leading edges of signals $A_1$ and $B_1$ is first received by the first delay comparator 482, such that the first sign signal reflects the order of the leading edges of signals $A_1$ and $B_1$ applied to the first input 492 and threshold input 494 of the delay comparator 482. The AND gate 476 and the delay comparator 482 generate signals A2 and $B_2$ which are applied to the AND gate 478 and the delay comparator 484 of the third stage 104. The delay comparator 484 outputs a second sign signal ("1" or "0") on a second digital line 412 to the calibration engine/controller 40. The second sign signal is based on which one of the leading edges of the signals A2 and $B_2$ is first received by the second delay comparator 484, such that the second sign signal reflects the order of the leading edges of the signals A2 and $B_2$ applied to the inputs 492 and 494 of the second delay comparator 484.

Since the delay between signals $A_1$ and $B_1$ can be predicted as a function of the voltage V, and vice versa, and since the delay between the signals $A_{N+1}$ and $B_{N+1}$ output by a successive stage can be predicted as a function of the signals $A_N$ and $B_N$ received from the preceding stage, and vice versa, the sign signals output by the delay comparators of the cascade of stages can be predicted as a function of the voltage V, and vice versa. Therefore, during the operation mode, a code made up of the sign signals may be reliably compared to a predetermined correlation to determine an approximation of the input voltage $V_{IN}$. During the calibration mode, the delay correction elements 500, 502 and 504 (FIG. 3) may be corrected until the sign signals output by the delay comparators toggle as expected for a known voltage $V_{DAC}$.

As noted above, in the calibration mode, the back end 100 (FIG. 1) works with the calibration engine/controller 40 to determine correction values for the multi-bit stage 98 and the single-bit stages 102, 104, 106 and 108. When the analog-to-digital converter 10 is in the operation mode, correction signals are applied, on lines 122, 124, 126, 128 and 130, so that the multi-bit stage 98 and the single-bit stages 98, 102, 104, 106 and 108 operate as desired. In the example illustrated in the drawings, the correction signals (on lines 122, 124, 126, 128 and 130) cause variable delay elements 500, 502 and 504 to increase or decrease the delay of signals $B_0$, $B_1$ and $B_2$ by amounts corresponding to the respective correction values, under the control of the calibration engine/controller 40.

If desired, the illustrated analog-to-digital converter 10 may be only one of many analog-to-digital converters in a larger system, such as a radio-frequency sampling receiver. For example, eight or more such analog-to-digital converters may be used within the larger system to simultaneously process the input voltage signal $V_{IN}$. Processing all of the information from all of the analog-to-digital converters in parallel may place high demands on the larger system, and may require high power routing buffers and re-latching after some routing to prevent data corruption since all bits are dynamically changing. According to the present disclosure, to ease timing requirements within the larger system, and to save interface area and power, digital outputs from the stages 98, 102, 104, 106 and 108 may be converted to pseudo-static signals before the signals are output to the calibration engine/controller 40. Doing so may reduce the number of computations required within the calibration engine/controller 40 to toggle the digital output from one value to a next higher value, and vice versa.

In some example embodiments, the calibration of the analog-to-digital converter 10 is done in a binary fashion. If the digital output 110 for the greatest value possible for input voltage V is 10000, then the digital output 110 should transition from 0111 to 1000 at about 50% of the greatest value possible for the input voltage V, and from 0011 to 0100 at about 25% of the greatest value possible for the input voltage V, and so forth. Thus, the converter 10 may be calibrated by setting the known voltage $V_{DAC}$ to 50% of the greatest value possible for the input voltage V and adjusting the delay elements 500, 502 and 504 until the digital output 110 toggles between 0111 and 1000. Alternatively, the converter 10 may be calibrated by setting the known voltage $V_{DAC}$ to 25% of the greatest value possible for the input voltage V and adjusting the delay elements until the digital output 110 toggles between 0011 and 0100. Such processing may require a large number of transitions of the digital output from one value (0111 and 0011 in these examples) to the next higher value (1000 and 0100 in these examples), and vice versa. In either case, the digital signals generated by the analog-to-digital converter 10 may need to be transmitted (routed) to the calibration engine/controller 40 at the operating speed of the analog-to-digital converter 10.

To be able to process the digital information generated by the one or more analog-to-digital converters more easily, and/or more efficiently, and/or with more relaxed timing requirements, the present disclosure contemplates converting the digital output from the binary value on lines 112, 408 and 412 to a binary transition value, such that, whenever a digital output toggles from one value to the next-highest value, or vice versa, only one bit within the binary transition value of the digital output is changed.

As illustrated in the table below, the relation between binary transition values and binary values may be as follows: binary transition[n−1]=binary[n−1]^binary[n], where n is the binary location (bit number of the binary value), and ^ represents a binary "xor" (exclusive-or) operation. This formula converts binary values to binary transition values. Examples of how the formula works to calculate binary transitions are provided in Table 1 below for code values of 0, 1, 14, 15 and 16.

TABLE 1

| Code | Binary | | | | | Binary transition | | | |
|---|---|---|---|---|---|---|---|---|---|
| 0 | 0 | 0 | 0 | 0 | 0 | 0 | 0 | 0 | 0 |
| 1 | 0 | 0 | 0 | 0 | 1 | 0 | 0 | 0 | 1 |
| . | . | . | . | . | . | . | . | . | . |
| . | . | . | . | . | . | . | . | . | . |
| . | . | . | . | . | . | . | . | . | . |
| 14 | 0 | 1 | 1 | 1 | 0 | 1 | 0 | 0 | 1 |
| 15 | 0 | 1 | 1 | 1 | 1 | 1 | 0 | 0 | 0 |
| 16 | 1 | 0 | 0 | 0 | 1 | 1 | 0 | 0 | 0 |

Thus, when code=15, the binary value is 01111. The fourth bit, which in this example is the most significant bit or left-most bit, is retained as it is ("0"). The other bits are obtained using the above formula. The third bit (1) is retained as 1, because 1^0 is 1. The second, first, and $0^{th}$ bits each become 0, since 1^1 is 0. Hence, the binary-transition representation of code=15 is 01000. Meanwhile, the binary representation of code=16 is 10000. If there were no binary-transition operation, a change from code=15 to code=16 would require all of the bit values of the binary representation of code=15 to change (from 01111 to 10000). In the illustrated example, however, the binary transition for code=15 is 01000 while the binary transition for code=16 is 11000). As a result, a change from code=15 to code=16 requires changing only one bit value.

Each stage 98, 102, 104, 106 and 108 of the back end 100 is inherently non-linear. In certain circumstances, one or more of the stages 98, 102, 104, 106 and 108 may be highly non-linear, with a total harmonic distortion (THD) less than −5 dB. In general, each successive stage may be more non-linear than the stage which preceded it, because the inputs into the successive stage contain the non-linearity created by the preceding stage(s). According to the present disclosure, calibration of the back end 100 of the analog-to-digital converter 10, and especially calibration of the later stages 106 and 108, may be performed in a desirable and satisfactory manner. The later stages 106 and 108 may be especially difficult to calibrate if required to do so using the signals generated by the preceding stages, because those signals themselves contain non-linearity generated by the preceding stages. The present disclosure is not limited, however to the configurations shown and described herein. What is shown and described herein is intended to be only examples. The teachings of the present disclosure may be used in connection with other highly non-linear multi-stage analog-to-digital converters and processes and still be within the scope of the claims.

In general, it is possible to reduce non-linearity in certain devices by over-designing the devices. However, that approach tends to undesirably increase area and power requirements, sometimes drastically, especially to accommodate a wide range of temperatures. In addition, over-designing may not be scalable at lower process nodes (that is, process nodes with larger geometries), since the analog domain at such nodes tends to be more non-linear. Factory trim processes (where devices are "trimmed" at the fabrication facility) is possible, but it may be difficult to trim later stages of an analog-to-digital device because such stages operate in a highly non-linear manner. Furthermore, it is difficult to track temperature and other changes, especially in the later stages, as needed for a factory trim process.

In the configuration illustrated in FIG. 1, each stage of the back end 100 may be highly non-linear. Moreover, the input to each stage comes as a "residue" of the previous stage. The "residue" generated by each stage is non-linear because, among other reasons, the comparator delay 7102 (FIG. 7) generated by the stage is logarithmic (non-linear), such that the output-signal delay T_OUT (FIG. 8) of the signals applied to the successive stage is also logarithmic (non-linear). For example, in the operation mode, the input to the third single-bit stage 106 is the output from the second single-bit stage 104. At some point in the sequence of stages, the input itself becomes highly non-linear. Moreover, for the later stages, thermal noise may affect estimation and simple averaging may not help due to non-linearity. Thus, the present disclosure provides a configuration for calibrating the later stages of the back end 100, especially the stages that receive highly non-linear inputs, such as for example, the third through i-th single-bit stages 106 and 108.

According to the present disclosure, the outputs of the pre-amplifiers 28, 30, 32 (FIG. 2) may be fairly linear, or, at least, more linear than the residue-based output of the second single-bit stage 104. Therefore, a bypass line 150 is provided to bypass the first few stages (in the illustrated configuration, the first multi-bit stage 98 and the first and second single-bit stages 102 and 104). The delay signal from the pre-amplifier array 20 may be fed directly to the last few stages 106 and 108 of the back end 100 to overcome the non-linearity of outputs of the previous stages 98, 102 and 104.

The delay signal on the bypass line 150 is fed directly from the pre-amplifier array 20 to the intermediate stage (in the illustrated configuration, the intermediate stage is the third single-bit stage 106), via the second multiplexer 152. If desired, for example, to improve performance even more, one or more additional bypass paths (not illustrated) may be used to transmit delay signals directly from the pre-amplifier array 20 to other stages of the back end 100. Moreover, the principles described herein may be applicable to any suitable cascade of non-linear stages. In the example illustrated in FIG. 1, the analog-to-digital converter 10 has a cascade of delay-based stages 98, 102, 104, 106 and 108. However, an analog-to-digital converter may be constructed in accordance with this disclosure without employing delay-based stages.

The second multiplexer 152 is controlled by the calibration engine/processor 40. In the illustrated configuration, the second multiplexer 152 is used, under the control of the calibration engine/processor 40, to selectively apply, or not apply, the delay signal on bypass line 150 to the third single-bit stage 106. In the operation mode, the delay signal applied to the third single-bit stage 106 is the residue-based output from the second single-bit stage 104, transmitted through the second multiplexer 152. During calibration of the later stages 106 and 108, the delay signal applied to the third single-bit stage 106 is the delay signal on bypass line 150, transmitted through the second multiplexer 152.

Although the analog-to-digital converter 10 illustrated in the drawings has a single bypass line 150, this disclosure is also applicable to back ends for analog-to-digital converters which have any desired number of bypass lines. The number of bypass lines for such analog-to-digital converters may be zero, one or more. The present disclosure is not limited to the use of just one bypass line. For an analog-to-digital converter which has more than one bypass line, the bypass lines may carry the same delay signals (from the most linear source) but may be connected to different intermediate stages. Wherever this disclosure, or the appended claims, uses the term "a," "an," "a first" or "another" element, or the equivalent thereof, it should be interpreted to include one or more than one such element, neither requiring nor excluding two or more such elements.

In some example embodiments, the optimum pre-amplifiers, from among the array of pre-amplifiers 28, 30 and 32, may be used to calibrate the back end 100. The pre-amplifier which is optimum for calibrating one device within the back end 100 may be different from the pre-amplifier which is optimum for calibrating another device within the back end 100. For example, the highest-gain pre-amplifier may be the optimum pre-amplifier for calibrating the first stage 98 of the back end 100 because using the high-gain output of that pre-amplifier for calibration purposes will help ensure that the back end 100 is not saturated for any pre-amplifier. Meanwhile, the pre-amplifier with the lowest gain affects performance since its output (a low-gain delay signal) is difficult to resolve; hence, the lowest-gain pre-amplifier may be selected as the optimum pre-amplifier for calibration of the later stages 106, 108. According to the present disclosure, different ones of the pre-amplifiers 28, 30 and 32 may be used for calibration of different ones of the stages 98, 102, 104, 106 and 108. In particular, a pre-amplifier is selected, and hence a calibration voltage $V_{DAC}$ correlated to the selected pre-amplifier, based on saturation and performance requirements.

In the illustrated configuration, during the calibration mode, the delay signal from the highest-gain pre-amplifier is applied to the multi-bit stage 98, to calibrate the multi-bit stage 98 and the first and second single-bit stages 102 and 104, but the delay signal from the lowest-gain pre-amplifier is applied to the third single-bit stage 106, to calibrate the third through i-th single-bit stages 106 and 108. The selection of the appropriate pre-amplifier for each calibration is performed by the calibration engine/controller 40, via a control signal applied to the delay multiplexer 34 on signal line 156.

The illustrated analog-to-digital converter 10 has first though n-th pre-amplifiers 28, 30 and 32 (FIG. 2), where n may be 5 or more. Each pre-amplifier 28, 30 and 32 converts voltage to delay. The pre-amplifiers 28, 30 and 32 in the illustrated pre-amplifier array 20 are centered around different voltages (called threshold voltages) supplied by first through n-th inputs 58, 60 and 62. Thus, the pre-amplifier array 20 contains n pre-amplifiers 28, 30 and 32, and, in the calibration mode, the calibration engine 40 has the ability to select different pre-amplifier delay outputs 22, 24 and 26 for different steps of calibration. For example, to calibrate the first stage 98, the calibration engine 40 may select the second pre-amplifier 30. To calibrate the second stage 102, the calibration engine 40 may select the fifth pre-amplifier 32 (where n=5).

In the analog-to-digital converter 10 illustrated in the drawings, the bypass line 150 is connected to the fourth stage 106. This disclosure is not limited, however, to the illustrated configuration. In particular, this disclosure is not limited to the particular arrangement of bypass line and stages illustrated in the drawings. For example, in an alternative configuration, a bypass line may be connected to a sixth stage.

Further, even when a bypass line is active, different pre-amplifiers may be selected for different steps and/or stages during the calibration process. For example, to calibrate a sixth stage, the calibration engine/controller 40 may select the second pre-amplifier 30, and to calibrate a seventh stage, the calibration engine/controller may select the third pre-amplifier. And even in connection with just one of the stages, the calibration engine 40 may select different pre-amplifiers for different purposes (that is, different specified requirements).

In an alternative configuration, there is no preamplifier array 20 but just a single pre-amplifier 28, in which case the delay multiplexer 34 is not required, and the delay output 22 of the single pre-amplifier 28 is connected to the first stage 98 and to the bypass line 150.

In the illustrated analog-to-digital converter 10, the first stage 98 generates a multi-bit output (on line 112) and each one of the successive stages 102, 104, 106 and 108 generates a single-bit output. In alternative configurations, there may be several multi-bit stages. Some of the multi-bit stages may generate a two-bit output. Other multi-bit stages may generate four-bit outputs. In other alternative configurations, there may be no multi-bit stages and only a cascade of single-bit stages. Alternatively, the first stage may generate a single bit output, the second stage may generate a four-bit output, the third stage may generate a single bit, the fourth stage may generate a two-bit output, and successive stages may generate single-bit outputs. Further, if desired, the output (on lines 96 and 150) of the delay multiplexer 34 may be connected to several (more than one) intermediate stages. The present disclosure is not limited to the illustrated analog-to-digital converter 10 which has only one intermediate stage 106. For example, there may be several delay multiplexers connected to the delay multiplexer 34. Each one of the multiple delay multiplexers may be connected to different intermediate stages.

The present disclosure relates to, among other things, a method (see FIG. 5) of calibrating an analog-to-digital converter 10. If desired, the method may be performed by the analog-to-digital converter 10 illustrated in FIG. 1. According to one aspect of the present disclosure, the method may include causing a voltage-to-delay device 20 to generate a delay signal, on line 96, based on a calibration voltage $V_{DAC}$ (Step 602). In the illustrated example, the voltage-to-delay device 20 may include an array of pre-amplifiers 20. A known calibration voltage $V_{DAC}$ is applied to the pre-amplifiers, which causes the pre-amplifiers to generate delay signals on lines 22, 24 and 26. During Step 602, one of the delay signals may be selected by a delay multiplexer 34 and output on line 96. Thus, during Step 602, the delay signal on line 96 is based on the calibration voltage $V_{DAC}$. In the calibration mode, changes in the calibration voltage $V_{DAC}$ create predictable changes in the delay signal on line 96.

Figure 5:
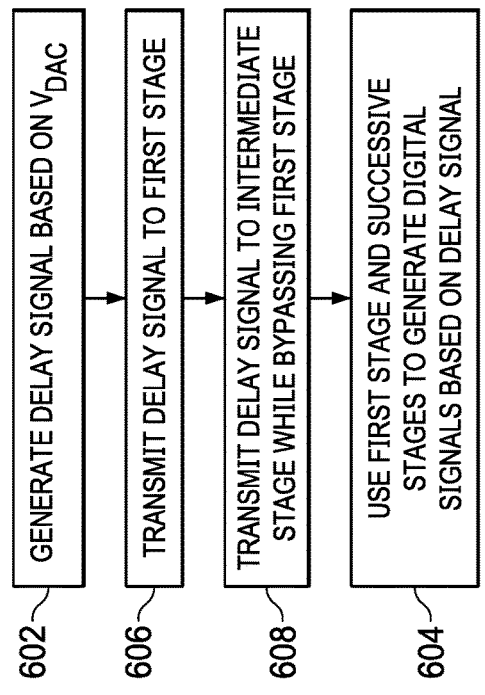
FIG. 5 is a flow chart for a method of calibrating the analog-to-digital converter of FIG. 1.

The method illustrated in FIG. 5 also includes causing a first delay-based stage 98 and successive delay-based stages 102, 104, 106 and 108 to generate digital signals (112, 408 and 412) based on the selected delay signal (Step 604). If desired, the stages 98, 102, 104, 106 and 108 have delay comparators which operate as described elsewhere in this disclosure. Further, the method illustrated in FIG. 5 includes transmitting the delay signal (on line 96) to the first delay-based stage 98 (Step 606), and transmitting, on line 150, the delay signal to an intermediate delay-based stage 106, while bypassing the first delay-based stage 98 (Step 608). According to one aspect of the present disclosure, the delay signal is input on line 150 to the intermediate delay-based stage 106 instead of an output signal from a preceding stage 104. An advantage of this aspect of the present disclosure is that the output signal from the preceding stage 104 is more non-linear than the delay signal on line 150. The inputs to the preceding stage 104 themselves contain non-linearity generated by even earlier stages 102 and 98, which contributes to the non-linearity of the intermediate stage 106.

Figure 6:
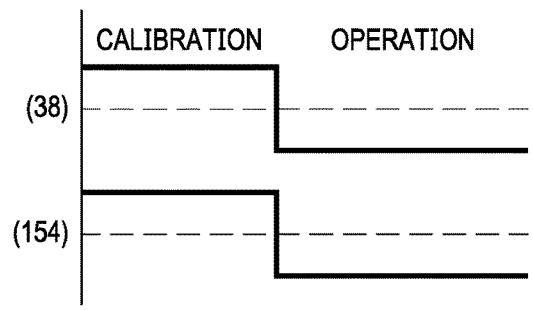
FIG. 6 is a timing diagram for the analog-to-digital converter of FIG. 1.

FIG. 6 is a timing diagram for the analog-to-digital converter 10. When the analog-to-digital converter 10 is in the operation mode, the control signal on line 38 is low, such that the first multiplexer 14 transmits the first voltage $V_{IN}$ to the pre-amplifier array 20 as the voltage V, and the control signal 154 is also low, such that the second multiplexer 152 transmits delay signals from the third stage 104 to the fourth stage 106. During the operation mode, the known voltage $V_{DAC}$ is not transmitted through the first delay multiplexer 14, and the delay signal on line 150 is not supplied to the fourth stage 106. During the operation mode, sign signals are transmitted from all of the stages 98, 102, 104, 106, 108 to the calibration engine/controller 40 which outputs a digital code for approximating the first voltage $V_{IN}$ based on the sign signals.

When the analog-to-digital converter 10 is in the calibration mode, the control signal on line 38 is high, such that the first multiplexer 14 does not transmit the first voltage $V_{IN}$ to the pre-amplifier array 20, and the control signal 154 is also high, such that the second multiplexer 152 does not transmit delay signals from the third stage 104 to the fourth stage 106. During the calibration mode, the known voltage $V_{DAC}$ is transmitted through the first delay multiplexer 14, and the delay signal on lines 96 and 150 is supplied to the first stage 98 and the fourth stage 106. During the calibration mode, sign signals are transmitted from all of the stages 98, 102, 104, 106, 108 to the calibration engine/controller 40 which outputs correction signals on lines 122, 124, 126, 128 and 130 to correct the delay elements 500, 502 and 504 based on the sign signals.

If desired, a pre-amplifier array 20 may be used to generate the delay signal based on an analog voltage $V_{IN}$, and a delay multiplexer 34 may be used to transmit delay signals to the first delay-based stage 98 and the intermediate one of the successive delay-based stages 102, 104, 106 and 108. Moreover, if desired, a first pre-amplifier may be selected from the pre-amplifier array 20 when the delay signal is applied, on line 96, to the first delay-based stage 98, and a second pre-amplifier (different from the first pre-amplifier) may be selected from the pre-amplifier array 20 when the delay signal is applied, on line 150, to the intermediate delay-based stage 106. If desired, the delay elements 500, 502 and 504 may be used to add and subtract delay to and from one or more of the first delay-based stage 98 and the successive delay-based stages 102, 104, 106 and 108. The delay elements 500, 502 and 504 may be controlled by correction signals on lines 122, 124, 126, 128 and 130.

Figure 9:
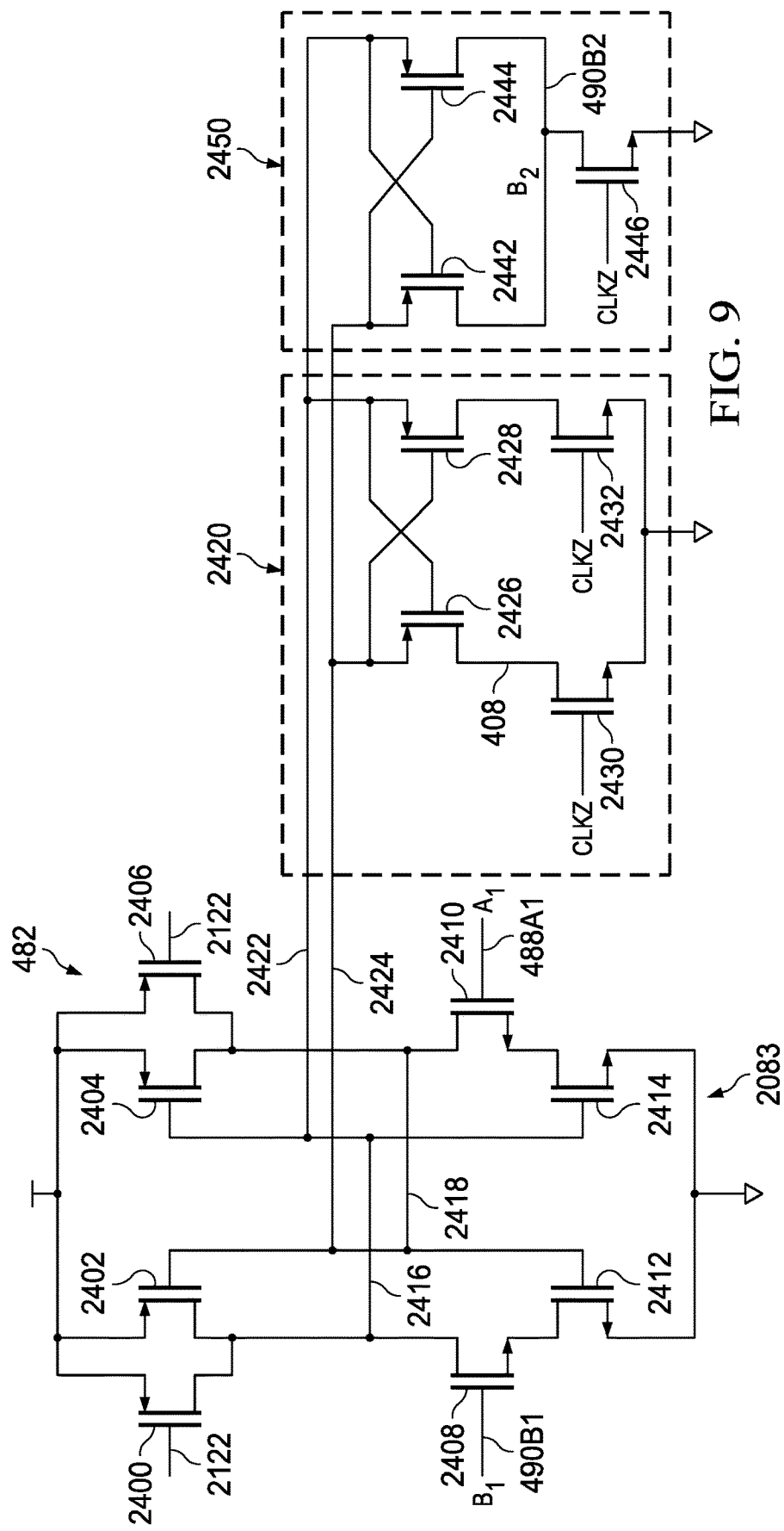
FIG. 9 is a circuit diagram of an example of a comparator circuit merged with sign-out and delay-out circuits for the analog-to-digital converter system of FIG. 1.

Referring now to FIG. 9, the delay comparator 482 has a comparator circuit 2083 which has first, second, third, fourth, fifth, sixth, seventh, and eighth transistors 2400, 2402, 2404, 2406, 2408, 2410, 2412 and 2414. The timing of the delay comparator 482 is controlled by a signal from a clock applied to the gates of the first and fourth transistors 2400, 2406, on a conductive line 2122. The first and second signals $A_1$, $B_1$ on lines 488A1 and 490B1 are applied to the gates of the sixth and fifth transistors 2410 and 2408, respectively. The drains of the first, second, and fifth transistors 2400, 2402 and 2408 are electrically connected to each other, and to the gates of the third and eighth transistors 2404 and 2414, via a first conductive line 2416. The drains of the third, fourth, and sixth transistors 2404, 2406 and 2410 are likewise electrically connected to each other, and to the gates of the second and seventh transistors 2402 and 2412, via a second conductive line 2418.

The first and second conductive lines 2416 and 2418 of the comparator circuit 2083 are electrically connected to a sign-out circuit 2420 via respective third and fourth conductive lines 2422 and 2424. As illustrated in FIG. 9, the sign-out circuit 2420 is merged with the comparator circuit 2083. The sign-out circuit 2420 has first, second, third and fourth transistors 2426, 2428, 2430 and 2432. The third conductive line 2422 is electrically connected to the gate and the source of the first and second transistors 2426 and 2428 of the sign-out circuit 2420, respectively, while the fourth conductive line 2424 is electrically connected to the source and the gate of the first and second transistors 2426 and 2428 of the sign-out circuit 2420, respectively.

In operation, when the delay comparator 482 is enabled by the clock signal on line 2122, a sign signal is generated within the sign-out circuit 2420 on line 408. The sign signal is forwarded to the calibration engine/processor 40 on line 408, and represents the order in which the output signals $A_1$ and $B_1$ arrive at the first and threshold inputs 492 and 494 of the delay comparator 482. The operation of the sign-out circuit 2420 is controlled by an inverted clock signal CLKZ applied to the gates of the third and fourth transistors 2430 and 2432 of the sign-out circuit 2420. The inverted clock signal CLKZ is an inverted version of the clock signal that is applied to the gates of the first and fourth transistors 2400 and 2406 of the comparator circuit 2083 on line 2122.

The third and fourth conductive lines 2422 and 2444 are also electrically connected to a delay-out circuit 2450. As illustrated in FIG. 9, the delay-out circuit 2450 is merged with the comparator circuit 2083. The delay-out circuit 2450 has first, second and third transistors 2442, 2444 and 2446. The third conductive line 2422 is electrically connected to the gate and the source of the first and second transistors 2442 and 2444 of the delay-out circuit 2450, respectively, while the fourth conductive line 2424 is electrically connected to the source and the gate of the first and second transistors 2442 and 2444 of the delay-out circuit 2450, respectively.

In operation, a delay signal $B_2$ is generated on line 490B2 which is electrically connected to the drains of both of the first and second transistors 2442, 2444 of the delay-out circuit 2450. The timing of the leading edge of the delay signal $B_2$ on line 490B2 relative to the timing of the earlier-arriving of the leading edges of the signals $A_1$ and $B_2$ on inputs 492 and 494 is the comparator delay 7102 (FIG. 7). The operation of the delay-out circuit 2450 (FIG. 9) is controlled by the same inverted clock signal CLKZ that is applied to the third and fourth transistors 2430, 2432 of the sign-out circuit 2420. The inverted clock signal CLKZ is applied to the gate of the third transistor 2446 of the delay-out circuit 2450. The drain of the third transistor 2446 of the delay-out circuit 2450 is electrically connected to the drains of the first and second transistors 2442, 2444 of the delay-out circuit 2450.

Figure 10:
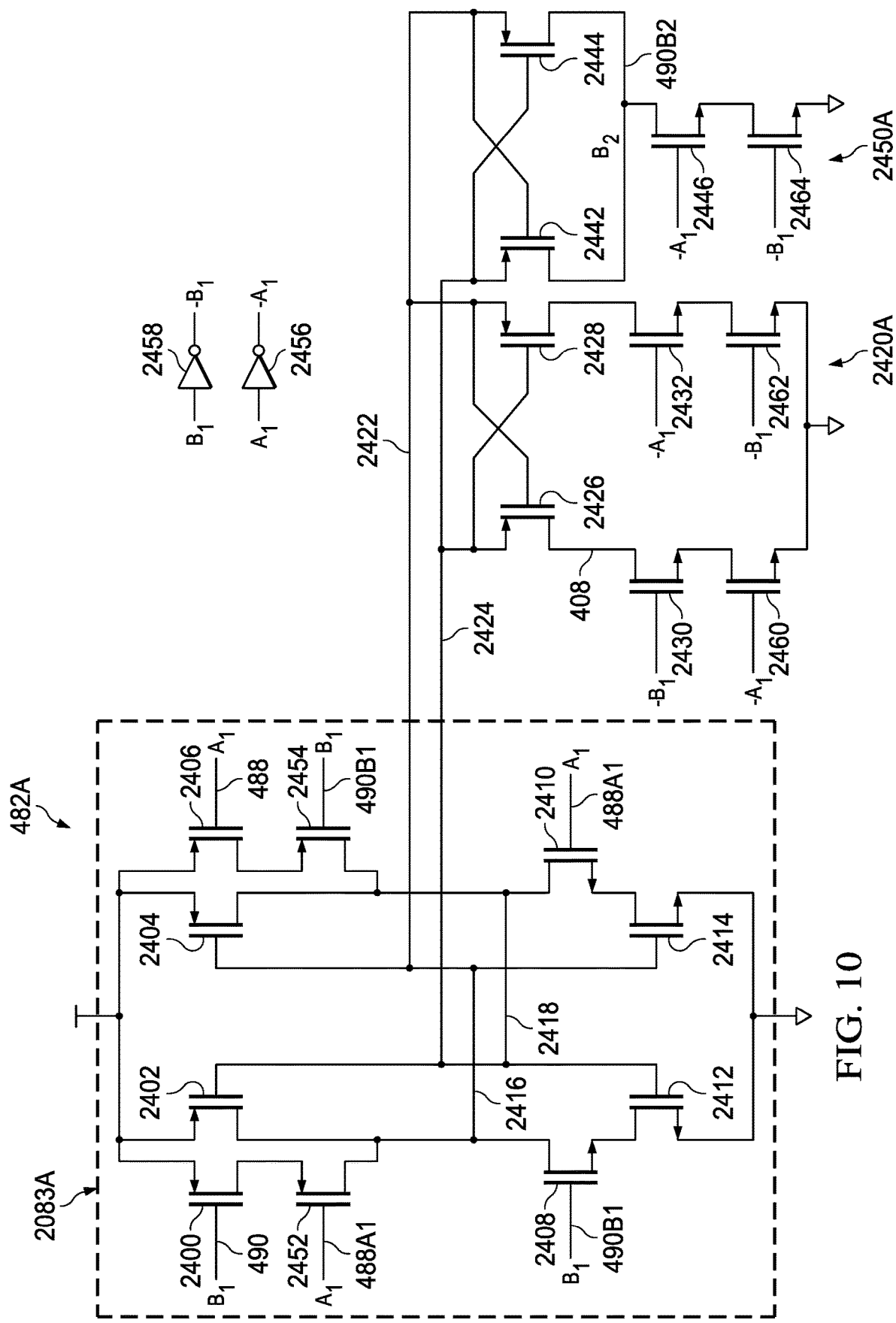
FIGS. 10 and 11 are circuit diagrams of other examples of comparator circuits merged with sign-out and delay-out circuits.

A clock-less delay comparator 482A is illustrated in FIG. 10. If desired, the clock-less delay comparator 482A may be used in the system 10 in place of the delay comparator 482 illustrated in FIGS. 3 and 9. The clock-less delay comparator 482A is similar to the delay comparator 482 illustrated in FIG. 9 except that (1) the clock-less delay comparator 482A has a comparator circuit 2083A which uses the later-arriving of the signals $A_1$ and $B_1$, applied to the first and threshold inputs 492 and 494, instead of the clock signal, and (2) inverted signals $-A_1$ and $-B_1$ are used to control the operation of a sign-out circuit 2420A and a delay-out circuit 2450A.

As illustrated in FIG. 10, the comparator circuit 2083A has first and second extra transistors 2452, 2454. The first input signal $A_1$ is applied, on the first input line 492, to the gates of the fourth and first-extra transistors 2406, 2452, and the second input signal $B_1$ is applied, on the threshold input line 490B1, to the first and second-extra transistors 2400, 2454. The first and first-extra transistors 2400 and 2452 are electrically connected to each other in series, and the fourth and second-extra transistors 2406, 2454 are electrically connected to each other in series. Thus, the clock-less delay comparator 482A is enabled by the arrival of the later-arriving of the two input signals $A_1$ and $B_1$.

At the same time, the first and second input signals $A_1$ and $B_2$ are applied to respective inverter gates 2456 and 2458, which generate respective inverted signals $-A_1$ and $-B_1$. The logic levels of the inverted signals $-A_1$ and $-B_1$ are the opposite of those of the respective input signals $A_1$ and $B_1$. In operation, when the clock-less delay comparator 2083A is enabled, a sign signal is generated within the sign-out circuit 2420A, on line 408. As illustrated in FIG. 10, the sign-out circuit 2420A is merged with the comparator circuit 482A. Similar to the operation of the delay comparator 482 illustrated in FIG. 9, the sign signal in the FIG. 10 configuration is forwarded to the calibration engine/processor 40 on line 408, and represents the order in which the output signals $A_1$ and $B_1$ arrive at the first and threshold inputs 492 and 494 of the clock-less delay comparator 482A.

The inverted signals $-A_1$ and $-B_1$ are applied to the third and fourth transistors 2430 and 2432 of the sign out circuit 2420A, and to two extra transistors 2460, 2462. In the illustrated configuration, the first inverted signal $-A_1$ is applied to the fourth and first-extra transistors 2432, 2460 of the sign-out circuit 2420A, and the third and first-extra transistors 2430, 2460 of the sign-out circuit 2420A are electrically connected to each other in series. The second inverted signal $-B_1$ is applied to the third and second-extra transistors 2430 and 2462 of the sign-out circuit 2420A, and the fourth and second-extra transistors 2432 and 2462 of the sign-out circuit 2420A are electrically connected to each other in series. Thus, the operation of the sign-out circuit 2420A is controlled by both of the inverted signals $-A_1$ and $-B_1$.

As illustrated in FIG. 10, the first and second conductive lines 2416 and 2418 of the comparator circuit 2083A are also electrically connected to a delay-out circuit 2450A, via the third and fourth conductive lines 2422, 2444. The delay-out circuit 2450A is merged within the clock-less delay comparator 482A. The delay-out circuit 2450A has an extra transistor 2464. In operation, when the clock-less delay comparator 482A is enabled, a delay signal $B_2$ is generated on line 490B2. The timing of the leading edge of the delay signal $B_2$ on line 490B2 relative to the timing of the earlier-arriving of the leading edges of the signals $A_1$ and $B_2$ on inputs 492 and 494 is the comparator delay 7102. The timing of the delay-out circuit 2450A is controlled by both of the inverted signals $-A_1$ and $-B_1$, which are applied to the third transistor 2446 and the extra transistor 2464. In the FIG. 10 configuration, the third and extra transistors 2446 and 2464 of the delay-out circuit 2450A are connected to each other in series between the drains of the first and second transistors 2442 and 2444 of the delay-out circuit 2450A and ground.

Figure 11:
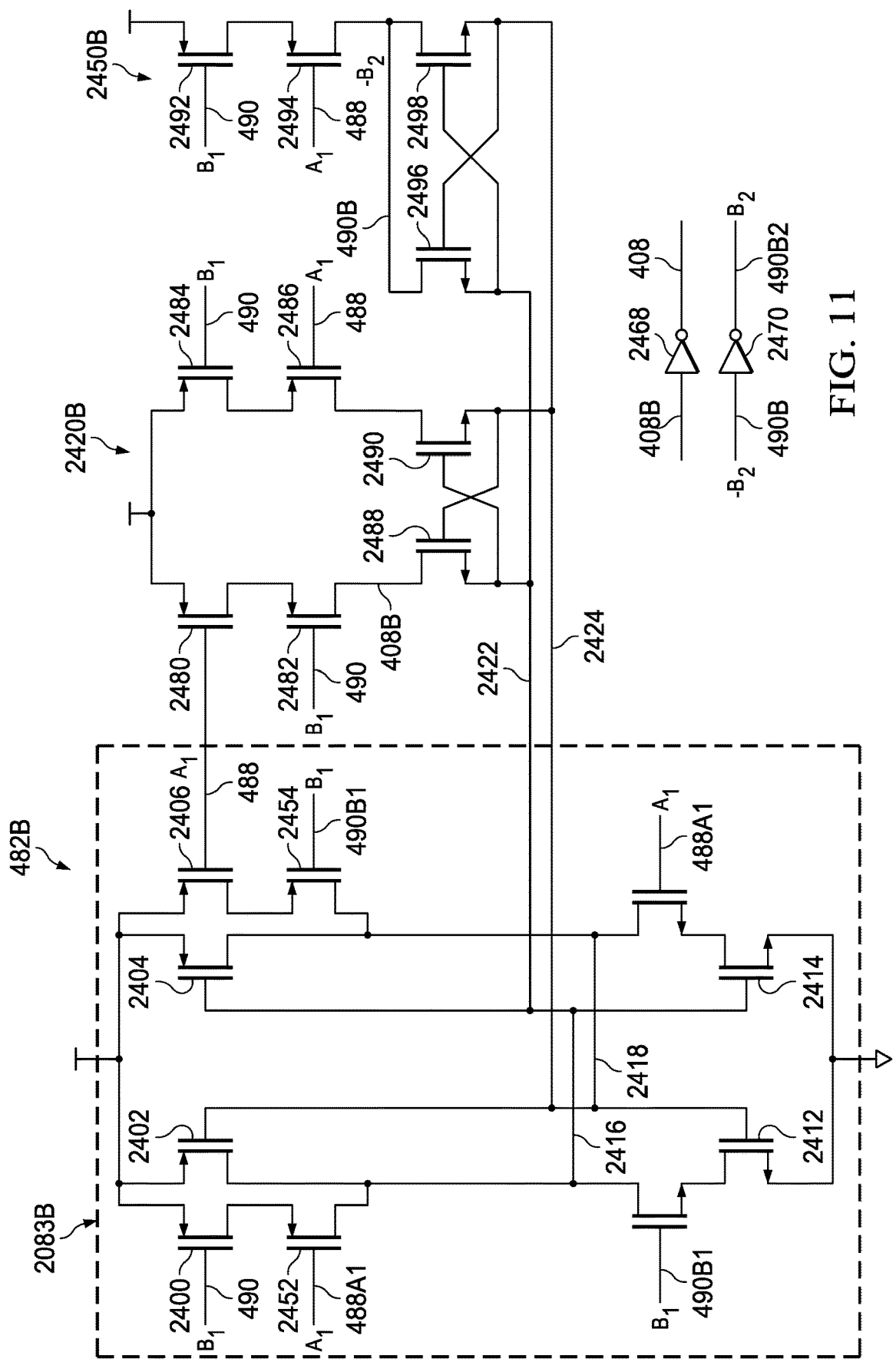

Whereas the merged clock-less comparator 482A illustrated in FIG. 10 has a p-barrier configuration, a second merged clock-less comparator 482B illustrated in FIG. 11 has an n-barrier configuration. The difference between the compositions of the transistors illustrated in FIGS. 10 and 11 is reflected in differences between the circuits illustrated in FIGS. 10 and 11. The second clock-less delay comparator 482B is similar to the clock-less delay comparator 482A illustrated in FIG. 10 except that (1) the non-inverted input signals $A_1$ and $B_1$ are used to control the operation of inverted sign-out and inverted delay-out circuits 2420B and 2450B in the second clock-less delay comparator 482B, and (2) inverter gates 2468, 2470 are used in the FIG. 11 configuration to generate the non-inverted sign signal on digital line 408 and the non-inverted delay signal $B_2$ on line 490B2.

As illustrated in FIG. 11, the inverted sign-out circuit 2420B, which is merged with the comparator circuit 2083B, has first, second, third, fourth, fifth and sixth transistors 2480, 2484, 2482, 2486, 2488 and 2490. The sources of the fifth and sixth transistors 2488 and 2490 are electrically connected to the third and fourth conductive lines 2422 and 2424, respectively. The gates of the fifth and sixth transistors 2488 and 2490 are electrically connected to the fourth and third conductive lines 2424 and 2422, respectively. In operation, an inverted sign signal is generated within the inverted sign-out circuit 2420B, on line 408B.

The inverted sign signal on line 408B is inverted by one of the inverter gates 2468 to generate the non-inverted sign-out signal on line 408, which is applied to the calibration engine/processor 40 (not illustrated in FIG. 11). The non-inverted sign-out signal represents the order in which the input signals $A_1$ and $B_1$ arrive at the first and threshold inputs 492 and 494 of the second clock-less delay comparator 482B. The operation of the inverted sign-out circuit 2420B is controlled by the first and second input signals $A_1$ and $B_1$, which are applied to the first and fourth transistors 2480 and 2486, and to the second and third transistors 2484 and 2482, respectively, on the first and threshold inputs 492 and 494, respectively.

The first and second conductive lines 2416 and 2418 are electrically connected to the inverted delay-out circuit 2450B via the third and fourth conductive lines 2422 and 2444, respectively. The inverted delay-out circuit 2450B has first, second, third and fourth transistors 2492, 2494, 2496 and 2498. In operation, when the second clock-less delay comparator 482B is enabled, an inverted delay signal $-B_2$ is generated on line 490B. The inverted delay signal $-B_2$ is inverted by the second inverter 2470 to generate the non-inverted delay signal $B_2$. The timing of the leading edge of the non-inverted delay signal $B_2$ on line 490B2 relative to the timing of the earlier-arriving of the leading edges of the signals $A_1$ and $B_1$ on the comparator inputs 492 and 494 is the comparator delay 7102.

As illustrated in FIG. 11, the sources of the third and fourth transistors 2496 and 2498 of the inverted delay-out circuit 2450B are electrically connected to the third and fourth conductive lines 2422 and 2424, respectively. The gates of the third and fourth transistors 2496 and 2498 of the inverted delay-out circuit 2450B are electrically connected to the fourth and third conductive lines 2424 and 2422, respectively. The operation of the inverted delay-out circuit 2450B is controlled by both of the input signals $A_1$ and $B_1$, which are applied to the gates of the second and first transistors 2494 and 2492 of the inverted delay-out circuit 2450B. As illustrated in FIG. 11, the first and second transistors 2492, 2494 of the inverted delay-out circuit 2450B are electrically connected to each other in series.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, as noted above, wherever this disclosure or claims recite "a," "an," "a first" or "another" element, or the equivalent thereof, it should be interpreted to include one or more than one such element, neither requiring nor excluding two or more such elements.

What is claimed as new and desired to be protected by Letters Patent of the United States is:

1. An analog-to-digital converter comprising:
   a voltage-to-delay device having a first voltage input and a delay signal output, the delay signal output based on the first voltage input;
   a first delay-based stage having an output, the first delay-based stage having an input coupled to the delay signal output;
   successive delay-based stages, each having an input coupled to the output of the first delay-based stage through a preceding successive delay-based stage and each successive delay-based stage having a digital signal output based on the input of such successive delay-based stage; and
   a bypass line connected between the delay signal output and an input of an intermediate one of the successive delay-based stages.

2. The analog-to-digital converter of claim 1, wherein the voltage-to-delay device includes a pre-amplifier array for generating the delay signal based on the first voltage.

3. The analog-to-digital converter of claim 2, further comprising a first delay multiplexer located between the pre-amplifier array and the first delay-based stage, for transmitting a delay signal to the first delay-based stage and to the intermediate one of the successive delay-based stages.

4. The analog-to-digital converter of claim 3, further comprising a second delay multiplexer connected to the first delay multiplexer, for transmitting a residue signal from another one of the successive delay-based stages to the intermediate one of the successive delay-based stages, and for transmitting the delay signal from the first delay multiplexer to the intermediate one of the successive delay-based stages.

5. The analog-to-digital converter of claim 4, further comprising a calibration engine/controller connected to the first delay-based stage and the successive delay-based stages, for selecting a first pre-amplifier from the pre-amplifier array when the delay signal is applied to the first delay-based stage, and for selecting a second pre-amplifier from the pre-amplifier array when the delay signal is applied to the intermediate one of the successive delay-based stages.

6. The analog-to-digital converter of claim 1, further comprising a digital-to-analog converter connected to the voltage-to-delay device, for generating a calibration voltage to be applied to the voltage-to-delay device.

7. The analog-to-digital converter of claim 6, further comprising an analog multiplexer located between the digital-to-analog converter and the voltage-to-delay device, for selectively transmitting one of the first voltage and the calibration voltage.

8. An analog-to-digital converter comprising:
a front end having a first voltage input and a calibration voltage input, the front end having a voltage-to-delay device having a delay signal output based on the first voltage input; and
a back end connected to the front end and having a digital signal output representative of the first voltage and the calibration voltage; and
wherein the back end includes a first delay-based stage connected to the delay signal output, and successive delay-based stages coupled to the first delay-based stage for generating digital signals based on the delay signal output; and
wherein the analog-to-digital converter includes a bypass line connected between the delay signal output and an input of an intermediate one of the successive delay-based stages.

9. The analog-to-digital converter of claim 8, wherein the voltage-to-delay device includes a pre-amplifier array for generating the delay signal based on the first voltage.

10. The analog-to-digital converter of claim 9, further comprising a first delay multiplexer located between the pre-amplifier array and the first delay-based stage, for transmitting the delay signal to the first delay-based stage and to the intermediate one of the successive delay-based stages.

11. The analog-to-digital converter of claim 10, further comprising a second delay multiplexer connected to the first delay multiplexer, for transmitting a residue signal from one of the successive delay-based stages to the intermediate one of the successive delay-based stages, and for transmitting the delay signal from the first delay multiplexer to the intermediate one of the successive delay-based stages.

12. The analog-to-digital converter of claim 8, further comprising a calibration engine/controller connected to the first delay-based stage and the successive delay-based stages, for selecting a first pre-amplifier from the front end for generating a delay signal to be applied to the first delay-based stage, and for selecting a second pre-amplifier from the front end to generate a delay signal to be applied to the intermediate one of the successive delay-based stages.

13. The analog-to-digital converter of claim 8, further comprising delay circuits connectable to, and dis-connectable from, the delay-based stages to selectively calibrate the delay-based stages.

14. The analog-to-digital converter of claim 13, further comprising a digital-to-analog converter connected to the front end, for generating the calibration voltage, and an analog multiplexer located between the digital-to-analog converter and the voltage-to-delay device, for selectively transmitting, to the front end, one of the first voltage and the calibration voltage.

15. A method of calibrating an analog-to-digital converter having a voltage-to-delay device, a first delay-based stage and successive delay-based stages, the method comprising:
causing the voltage-to-delay device to generate a delay signal based on a calibration voltage;
providing the delay signal to the first delay-based stage;
providing an output of the first delay-based stage to an input of a successive delay-based stage, the output of the first delay-based staged based on the delay signal;
providing an output of each successive delay-based stage to an input of a next successive delay-based stage, the output of each successive delay-based stage is based on the input of such successive delay-based stage, and successive delay-based stages connected to the first delay-based stage, and causing the first delay-based stage and the successive delay-based stages to generate digital signals based on the delay signal; and
directly providing the delay signal to an intermediate one of the successive delay-based stages.

16. The method of claim 15, further comprising using a pre-amplifier array to generate the delay signal based on an analog voltage.

17. The method of claim 16, further comprising using a first delay multiplexer located between the pre-amplifier array and the first delay-based stage to transmit delay signals to the first delay-based stage and the intermediate one of the successive delay-based stages.

18. The method of claim 16, further comprising selecting a first pre-amplifier from the pre-amplifier array when the delay signal is applied to the first delay-based stage, and selecting a second pre-amplifier from the pre-amplifier array when the delay signal is applied to the intermediate one of the successive delay-based stages.

19. The method of claim 16, further comprising adding and subtracting delay to and from one or more of the first delay-based stage and the successive delay-based stages.

20. An analog-to-digital converter comprising:
a circuit device for generating a front end signal based on a first voltage;
a first non-linear stage connected to the circuit device, and successive non-linear stages connected to the first non-linear stage, for generating digital signals based on the front end signal;
a first line connected to the circuit device, for transmitting the front end signal to the first non-linear stage; and
a bypass line connected to the circuit device, for transmitting the front end signal to an intermediate one of the successive non-linear stages.

21. The analog-to-digital converter of claim 20, wherein the first and successive non-linear stages are delay-based stages.

* * * * *